United States Patent
Chen

(10) Patent No.: US 11,637,443 B2
(45) Date of Patent: Apr. 25, 2023

(54) BACKUP POWER SUPPLY FOR ELECTRONIC SYSTEM AND OPERATION METHOD THEREOF

(71) Applicant: Acer Incorporated, New Taipei (TW)

(72) Inventor: Shang-Hui Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 18 days.

(21) Appl. No.: 17/226,577

(22) Filed: Apr. 9, 2021

(65) Prior Publication Data
US 2021/0376654 A1 Dec. 2, 2021

(30) Foreign Application Priority Data
Jun. 2, 2020 (TW) ................. 109118439

(51) Int. Cl.
*H02J 9/06* (2006.01)
*G06F 1/30* (2006.01)
(52) U.S. Cl.
CPC ............... *H02J 9/061* (2013.01); *G06F 1/30* (2013.01)
(58) Field of Classification Search
None
See application file for complete search history.

(56) References Cited

U.S. PATENT DOCUMENTS

2002/0163338 A1  11/2002  Bertness

FOREIGN PATENT DOCUMENTS

| CN | 201838537 U | 5/2011 | | |
|----|----|----|----|----|
| EP | 1019934 B1 | 1/2002 | | |
| KR | 20080015215 A | * | 8/2014 | ............ H01M 2/10 |
| TW | M485518 U | 9/2014 | | |
| TW | I505531 B | 10/2015 | | |

* cited by examiner

*Primary Examiner* — Daniel Kessie
*Assistant Examiner* — Terrence R Willoughby
(74) *Attorney, Agent, or Firm* — Birch, Stewart, Kolasch & Birch, LLP

(57) ABSTRACT

An operation method for a backup power supply of an electronic system is provided. The backup power supply includes a fuse. The operation method includes: estimating a reading voltage error and a resistance of the fuse; reading a real-time battery discharging current; reading and calculating a voltage difference between two terminals of the fuse; and determining whether to send a fuse replacement message to the electronic system according to the voltage difference between the two terminals of the fuse, the reading voltage error, the resistance of the fuse and the real-time battery discharging current.

6 Claims, 3 Drawing Sheets

BACKUP POWER SUPPLY FOR ELECTRONIC SYSTEM AND OPERATION METHOD THEREOF

This application claims the benefit of Taiwan application Serial No. 109118439, filed Jun. 2, 2020, the subject matter of which is incorporated herein by reference.

BACKGROUND OF THE INVENTION

Field of the Invention

The invention relates in general to a backup power supply of an electronic system.

Description of the Related Art

Ideally, the servers can provide service to the users round the clock. Inevitably, when the power is interrupted accidentally, the servers will be unable to provide service. To resolve the said problem caused when the power supply is interrupted accidentally, each server is equipped with a backup power supply (a backup battery module). The battery module includes a fuse as a protection measure. When the fuse is blown, the power will be interrupted and the system will be shut down.

The most commonly used method to detect whether the fuse is blown is to detect the fuse by a comparator circuit. Although this method is convenient, it has a significant disadvantage, that is, the system is notified only after the fuse is blown.

SUMMARY OF THE INVENTION

According to one embodiment of the present invention, an operation method for a backup power supply of an electronic system is provided. The backup power supply includes a fuse. The operation method includes: estimating a reading voltage error and a resistance of the fuse: reading a real-time battery discharging current; reading and calculating a voltage difference between two terminals of the fuse; and determining whether to send a fuse replacement message to the electronic system according to the voltage difference between the two terminals of the fuse, the reading voltage error, the resistance of the fuse and the real-time battery discharging current.

According to another embodiment of the present invention, a backup power supply of an electronic system is provided. The backup power supply includes: a battery string configured to provide a power to the electronic system; a fuse coupled to the battery string; a battery monitoring protection unit coupled to the battery string and the fuse to monitor and protect the backup power supply: and a micro-controller processing unit coupled to the battery monitoring protection unit and the electronic system, wherein the micro-controller processing unit estimates a reading voltage error and a resistance of the fuse; the micro-controller processing unit reads a real-time battery discharging current; the micro-controller processing unit reads and calculates a voltage difference between two terminals of the fuse; the micro-controller processing unit determines whether to send a fuse replacement message to the electronic system according to the voltage difference between the two terminals of the fuse, the reading voltage error, the resistance of the fuse and the real-time battery discharging current.

The above and other aspects of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present invention has one or more technical features. Given that each embodiment is implementable, a person ordinarily skilled in the art can selectively implement or combine some or all of the technical features of any embodiment of the present invention.

Figure 1:
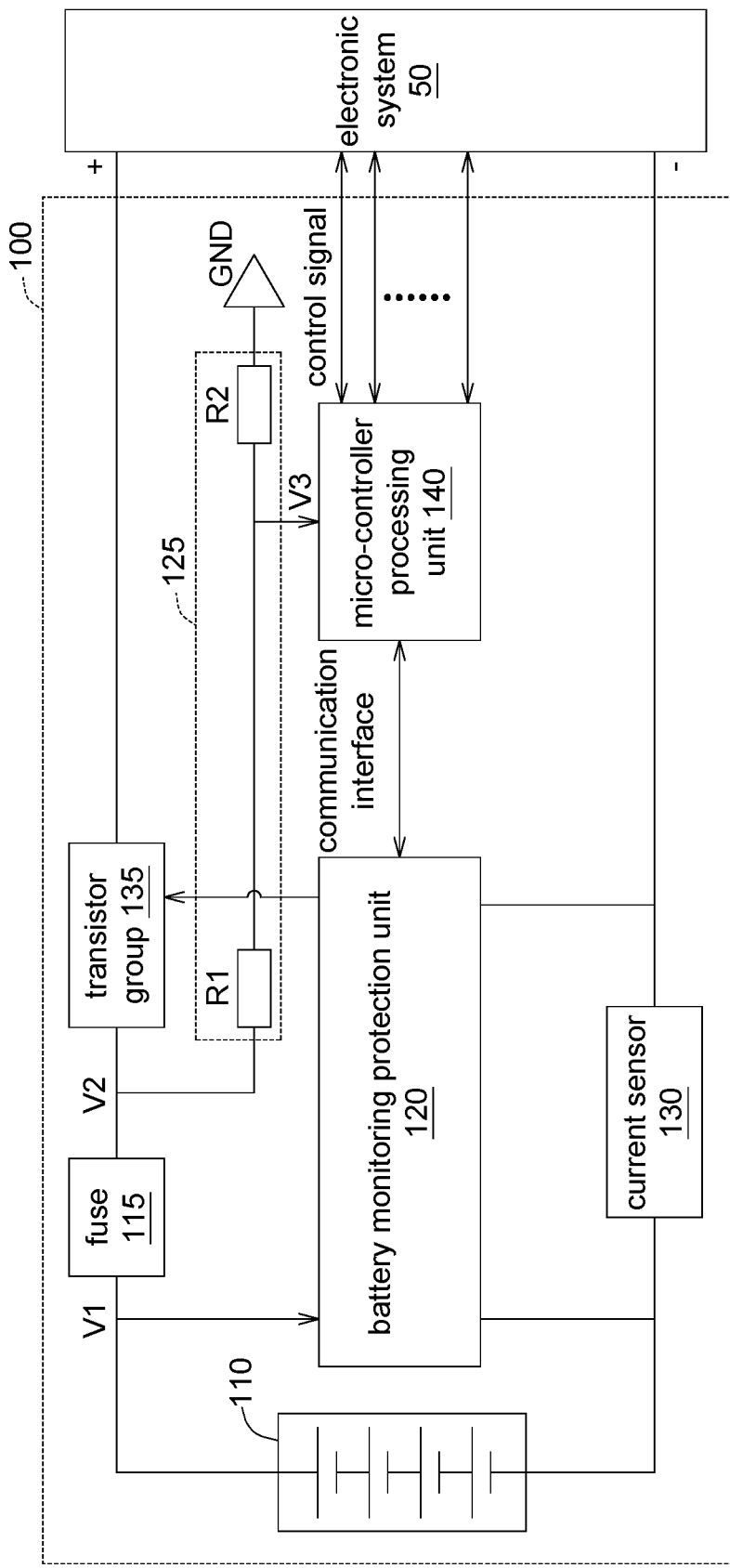
FIG. 1 is a system architecture diagram of a backup power supply according to an embodiment of the present invention.

FIG. 1 is a system architecture diagram of a backup power supply according to an embodiment of the present invention. In an embodiment as indicated in FIG. 1, the backup power supply 100 of the present invention provides a backup power to an electronic system 50 (the electronic system is exemplified by but not limited to a server).

The backup power supply 100 includes: a battery string 110, a fuse 115, a battery monitoring protection unit 120, a voltage divider unit 125, a current sensor 130, a transistor group 135 and a micro-controller processing unit 140.

The battery string 110 includes at least one battery cell. The battery string 110 provides a power to the electronic system 50.

The fuse 115 is coupled to the battery string 110 to protect the backup power supply 100. In an embodiment of the present invention, the resistance of the fuse 115 can be estimated.

The battery monitoring protection unit 120 is coupled to the battery string 110 and the fuse 115 to monitor and protect the backup power supply 100. Besides, the battery monitoring protection unit 120 can read battery voltage value (that is, the first terminal voltage V1 of the fuse 115).

The voltage divider unit 125 is coupled to the fuse 115 and the micro-controller processing unit 140. The voltage divider unit 125 divides the second terminal voltage V2 of the fuse 115 and further transmits a divided voltage V3 to the micro-controller processing unit 140. In an embodiment of the present invention, the second terminal voltage V2 of the fuse 115 is divided because the micro-controller processing unit 140 is not suitable to receive an excessive voltage. The voltage divider unit 125 includes two resistors R1 and R2 connected in series. Therefore, the voltage V3 received by the micro-controller processing unit 140 can be expressed as: $V3=V2*R2/(R1+R2)$.

The current sensor 130 is coupled between the battery string 110 and the electronic system 50 to sense a current flowing from the battery string 110.

The transistor group 135 is coupled to the fuse 115.

The micro-controller processing unit 140 is coupled to the voltage divider unit 125, the battery monitoring protection unit 120 and the electronic system 50. When the fuse is detected to be in an abnormal state, the micro-controller processing unit 140 transmits a control signal to the electronic system 50, such that the system administrator can perform subsequent processing, such as replacing the fuse. The micro-controller processing unit 140 and the battery monitoring protection unit 120 can communicate with each other through a communication interface.

In an embodiment of the present invention, two terminal voltages V1 and V2 of the fuse can be detected, wherein the voltage V1 is the voltage value read by the battery monitoring protection unit 120, and the voltage V2 is obtained from the voltage V3 read by the micro-controller processing unit 140.

In an embodiment of the present invention, the resistance R of the fuse 115 in a normal state as well as the reading voltage error $\Delta V$ between the voltage ready by the battery monitoring protection unit 120 and the voltage read by the micro-controller processing unit 140 is estimated.

Figure 2:
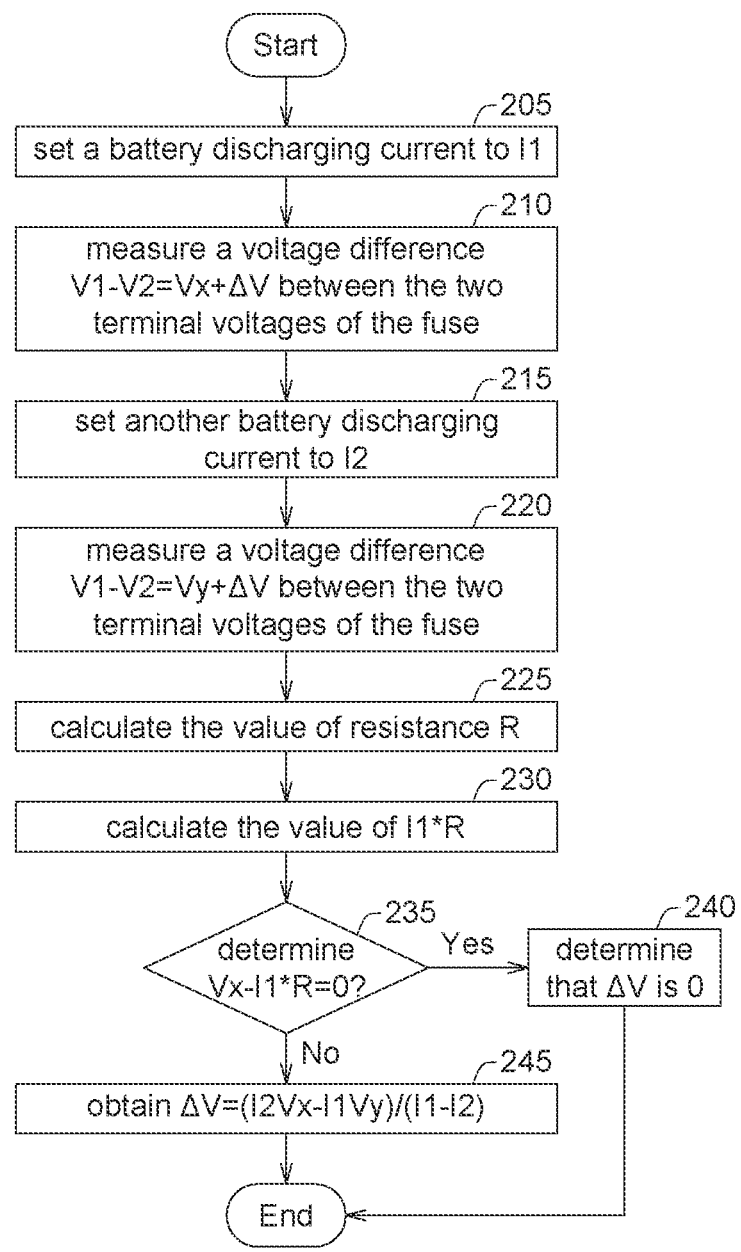
FIG. 2 is an error correction flowchart according to an embodiment of the present invention.

FIG. 2 is an error correction flowchart according to an embodiment of the present invention.

Suppose the fuse 115 has a resistance R in a normal state. When a current I flows through the fuse 115, the relation between V1 and V2 can be expressed as:

$$V2=V1-I*R \quad (1)$$

In step 205, the discharging current of the battery string 110 is set to I1 (the discharging current I1 is exemplified by but not limited to 100 A). In step 210, two terminal voltages V1 and V2 of the fuse 115 are measured and a voltage difference between the two terminal voltages V1 and V2 is obtained. The battery monitoring protection unit 120 transmits the voltage value V1 to the micro-controller processing unit 140 through a communication interface.

Ideally, (V1−V2)=I*R, and the resistance R of the fuse 115 is the quotient of the voltage difference (V1−V2) divided by I. However, when the battery monitoring protection unit 120 and the micro-controller processing unit 140 read voltage values, errors may occur. Suppose the voltage ready the battery monitoring protection unit 120 and the voltage read by the micro-controller processing unit 140 have a reading voltage error $\Delta V$. After taking the reading voltage error $\Delta V$ into consideration, the relation between V1 and V2 can be expressed:

$$(V1-V2)+\Delta V=I*R \quad (2)$$

To obtain an accurate value of resistance R, the reading voltage error $\Delta V$ needs to be deducted from formula (2).

In step 210, a voltage difference of (V1−V2)=Vx+$\Delta V$ is obtained (suppose the battery string 110 has a discharging current I1), wherein Vx represents the voltage difference between the voltages read at the two terminals of the fuse 115.

$$(V1-V2)=Vx+\Delta V=I1*R \quad (3)$$

In step 215, the discharging current of the battery string 110 is set to I2. In step 220, the value of (V1−V2) is equivalent to the value of (Vy+$\Delta V$) (suppose the battery string 110 has a discharging current I2), wherein Vy represents the voltage difference between the voltages read at the two terminals of the fuse 115:

$$(Vy+\Delta V)=I2*R \quad (4)$$

In step 225, the value of resistance R is obtained from formula (3) and formula (4):

$$R=Vx-Vy/(I1-I2) \quad (5)$$

In step 230, the value of I1*R is calculated by the micro-controller processing unit 140.

In step 235, whether the equation Vx−I1*R=0 holds true is determined by the micro-controller processing unit 140.

If the determination in step 235 is positive, this implies that $\Delta V=0$ (step 240).

If the determination in step 235 is negative, this implies that the value of $\Delta V$ is obtained by the micro-controller processing unit 140 according to formula (6) (step 245).

The micro-controller processing unit 140 substitutes the value of resistance R in formula (3) or formula (4) to obtain the value of the reading voltage error $\Delta V$ according to formula (6).

$$\Delta V=(I2Vx-I1Vy)/(I1-I2) \quad (6)$$

Based on the error correction of FIG. 2, the resistance R of the fuse 115 and the reading voltage error $\Delta V$ can be estimated.

Figure 3:
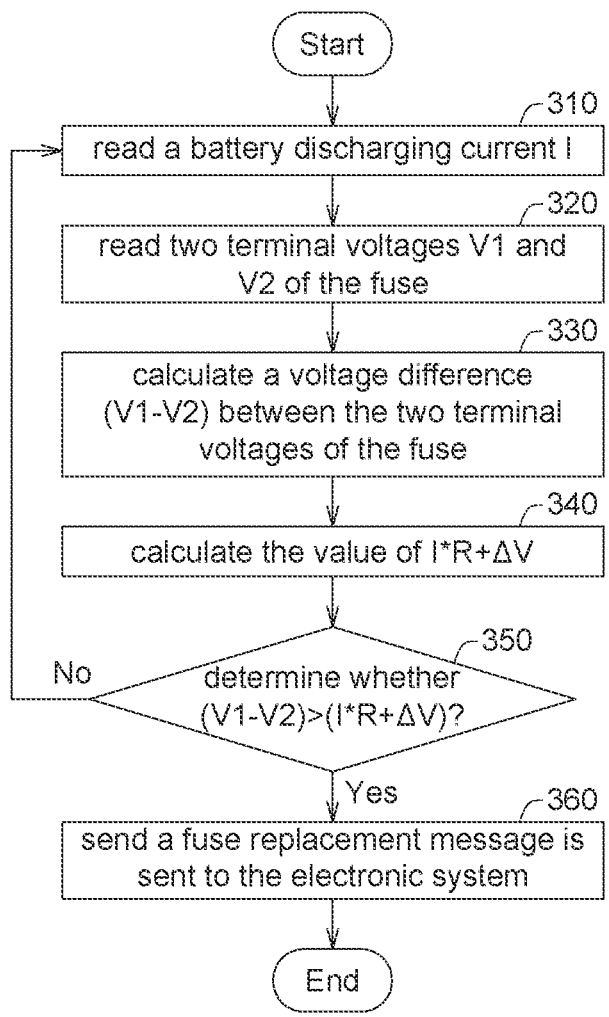
FIG. 3 is a fuse determination flowchart according to an embodiment of the present invention.

The determination of whether the fuse 115 is aged and needs to be replaced is disclosed in an embodiment of the present invention. FIG. 3 is a fuse determination flowchart according to an embodiment of the present invention. The determination process of FIG. 3 may be periodically or irregularly performed by the micro-controller processing unit 140 according to actual needs.

In step 310, the discharging current I of the battery string is read by the micro-controller processing unit 140.

In step 320, the two terminal voltages V1 and V2 of the fuse 115 are read by the micro-controller processing unit 140.

In step 330, a voltage difference (V1−V2) between the two terminal voltages V1 and V2 of the fuse 115 is calculated by the micro-controller processing unit 140.

In step 340, the value of (I*R+$\Delta V$) is calculated by the micro-controller processing unit 140, wherein the values of R and $\Delta V$ can be obtained according to FIG. 2.

In step 350, whether the value of (V1−V2) is greater than the value of (I*R+$\Delta V$) is determined by the micro-controller processing unit 140.

When the fuse 115 ages, the actual resistance of the fuse 115 is greater than the estimated value R obtained according to FIG. 2, and the value of (V1−V2) swells because a larger actual resistance makes the voltage difference between two terminals of the fuse larger. Thus, the value of (V1−V2) is greater than the value of (I*R+$\Delta V$).

Conversely, when the fuse 115 is not yet aged, the actual resistance of the fuse 115 is still equivalent to the estimated value R obtained according to FIG. 2, and the value of (V1−V2) is not greater than the value of (I*R+$\Delta V$).

Thus, if the determination in step 350 is positive, the method proceeds to step 360, a fuse replacement message is sent to the electronic system 50 by the micro-controller processing unit 140. Then, the system operator can replace the fuse according to the fuse replacement message.

If the determination in step 350 is negative, this implies that there is no need to replace the fuse, and the method returns to step 310.

In an embodiment of the present invention, when the micro-controller processing unit 140 determines that the fuse 115 is already aged and shows a sign of damage, the micro-controller processing unit 140 may immediately detect the sign and send a warning message, such that the system operator may replace the fuse 115 in time before the backup power supply 100 is interrupted.

The prior art normally requires an additional comparator IC to determine whether the fuse needs to be replaced, and therefore incurs additional circuit cost. In comparison to the prior art, the present invention allows the micro-controller processing unit 140 (the backup power supply normally includes the micro-controller processing unit 140) to determine whether the fuse needs to be replaced without using any additional comparator IC, and the cost of the comparator IC is saved.

Furthermore, the present invention determines whether the fuse needs to be replaced by way of software (the micro-controller processing unit 140) and produces a higher accuracy.

While the invention has been described by way of example and in terms of the embodiment(s), it is to be understood that the invention is not limited thereto. On the contrary, it is intended to cover various modifications and similar arrangements and procedures and the scope of the appended claims therefore should be accorded the broadest interpretation so as to encompass all such modifications and similar arrangements and procedures.

What is claimed is:

1. An operation method for a backup power supply of an electronic system, wherein the backup power supply comprises a fuse, and the operation method comprises:
    estimating a reading voltage error and a resistance of the fuse;
    reading a real-time battery discharging current;
    reading and calculating a voltage difference between two terminals of the fuse; and
    determining whether to send a fuse replacement message to the electronic system according to the voltage difference between the two terminals of the fuse, the reading voltage error, the resistance of the fuse and the real-time battery discharging current,
    wherein the step of estimating the reading voltage error and the resistance of the fuse comprises:
        setting a first discharging current;
        measuring a first voltage difference between the two terminals of the fuse, wherein the first voltage difference between the two terminals of the fuse comprises the reading voltage error;
        setting a second discharging current;
        measuring a second voltage difference between the two terminals of the fuse, wherein the second voltage difference between the two terminals of the fuse comprises the reading voltage error; and
        estimating the reading voltage error and the resistance of the fuse according to the first voltage difference between the two terminals of the fuse, the second voltage difference between the two terminals of the fuse, the first discharging current and the second discharging current.

2. The operation method according to claim 1, wherein when in the step of determining whether to send the fuse replacement message to the electronic system, whether the voltage difference between the two terminals of the fuse is greater than the value of (I*R+ΔV) is determined, wherein I, R and ΔV respectively represent the real-time battery discharging current, the resistance of the fuse and the reading voltage error.

3. The operation method according to claim 2, wherein when it is determined that the voltage difference between the two terminals of the fuse is greater than the value of (I*R+ΔV), it is determined that the fuse replacement message is sent to the electronic system.

4. A backup power supply of an electronic system comprises:
    a battery string configured to provide a power to the electronic system;
    a fuse coupled to the battery string;
    a battery monitoring protection unit coupled to the battery string and the fuse to monitor and protect the backup power supply; and
    a micro-controller processing unit coupled to the battery monitoring protection unit and the electronic system,
    wherein
    the micro-controller processing unit estimates a reading voltage error and a resistance of the fuse;
    the micro-controller processing unit reads a real-time battery discharging current;
    the micro-controller processing unit reads and calculates a voltage difference between two terminals of the fuse;
    the micro-controller processing unit determines whether to send a fuse replacement message to the electronic system according to the voltage difference between the two terminals of the fuse, the reading voltage error, the resistance of the fuse and the real-time battery discharging current,
    wherein when the micro-controller processing unit estimates the reading voltage error and the resistance of the fuse, the micro-controller processing unit performs:
        setting a first discharging current;
        measuring a first voltage difference between the two terminals of the fuse, wherein the first voltage difference between the two terminals of the fuse comprises the reading voltage error;
        setting a second discharging current;
        measuring a second voltage difference between the two terminals of the fuse, wherein the second voltage difference between the two terminals of the fuse comprises the reading voltage error; and
        estimating the reading voltage error and the resistance of the fuse according to the first voltage difference between the two terminals, the second voltage difference between the two terminals, the first discharging current and the second discharging current.

5. The backup power supply according to claim 4, wherein when the micro-controller processing unit determines whether to send the fuse replacement message to the electronic system, the micro-controller processing unit determines whether the voltage difference between the two terminals of the fuse is greater than the value of (I*R+ΔV), wherein I, R and ΔV respectively represent the real-time battery discharging current, the resistance of the fuse and the reading voltage error.

6. The backup power supply according to claim 5, wherein when the micro-controller processing unit determines that the voltage difference between the two terminals of the fuse is greater than the value of (I*R+ΔV), the micro-controller processing unit determines to send the fuse replacement message to the electronic system.

* * * * *